US009593406B2

(12) United States Patent
Chen et al.

(10) Patent No.: US 9,593,406 B2
(45) Date of Patent: Mar. 14, 2017

(54) OPTICAL DEVICE AND MANUFACTURE THEREOF

(71) Applicants: SINO-AMERICAN SILICON PRODUCTS INC., Hsinchu Science Park (TW); Miin-Jang Chen, Taipei (TW)

(72) Inventors: Miin-Jang Chen, Taipei (TW); Wen-Ching Hsu, Hsinchu Science Park (TW)

(73) Assignee: SINO-AMERICAN SILICON PRODUCTS INC., Taipei (TW)

( * ) Notice: Subject to any disclaimer, the term of this patent is extended or adjusted under 35 U.S.C. 154(b) by 0 days.

(21) Appl. No.: 14/550,239

(22) Filed: Nov. 21, 2014

(65) Prior Publication Data
US 2015/0140271 A1    May 21, 2015

(30) Foreign Application Priority Data
Nov. 21, 2013    (TW) .............................. 102142377 A (51) Int. Cl.
| H01L 31/0216 | (2014.01) |
| H01L 31/0224 | (2006.01) |
| H01L 31/0336 | (2006.01) |
| H01L 33/06 | (2010.01) |
| H01L 33/24 | (2010.01) |
| C23C 14/08 | (2006.01) |
| G02B 1/113 | (2015.01) |
| G02B 1/115 | (2015.01) |
| C23C 16/04 | (2006.01) |
| C23C 16/40 | (2006.01) |
| C23C 16/455 | (2006.01) |
| C23C 14/34 | (2006.01) |

(Continued)

(52) U.S. Cl.
CPC ............ *C23C 14/08* (2013.01); *C23C 16/045* (2013.01); *C23C 16/403* (2013.01); *C23C 16/45525* (2013.01); *G02B 1/113* (2013.01); *G02B 1/115* (2013.01); *C23C 14/34* (2013.01); *C23C 18/165* (2013.01); *C25D 5/10* (2013.01); *C25D 7/00* (2013.01); *Y10T 428/24364* (2015.01)

(58) Field of Classification Search
CPC ....... H01L 2924/00014; H01L 2924/00; H01L 2224/05644; H01L 2924/00012; H01L 2224/05144; H01L 2224/05155; H01L 2224/05166; H01L 2224/97; H01L 2224/03; H01L 2924/01032; H01L 2224/32225
USPC ............ 257/13, 91, 79, 88, 98, 103, E51.04; 438/47, 85
See application file for complete search history.

(56) References Cited

U.S. PATENT DOCUMENTS

| 2009/0068411 A1* | 3/2009 | Hong et al. .................... 428/172 |
| 2013/0099196 A1* | 4/2013 | Wu .................... H01L 21/02376 257/9 |

(Continued)

*Primary Examiner* — Kimberly Rizkallah
*Assistant Examiner* — Brian Turner
(74) *Attorney, Agent, or Firm* — Muncy, Geissler, Olds & Lowe, P.C.

(57) ABSTRACT

The invention provides an optical device and manufacture thereof. The optical device of the invention includes a transparent substrate, a seeding layer, a plurality of nano-rods and a protection layer. The seeding layer is formed to overlay an entrance surface and an exit surface of the transparent substrate. The plurality of nano-rods are formed on the seeding layer. The protection layer is formed to completely overlay the plurality of nano-rods.

17 Claims, 7 Drawing Sheets

(51) Int. Cl.
*C25D 5/10* (2006.01)
*C25D 7/00* (2006.01)
*C23C 18/16* (2006.01)

(56) References Cited

U.S. PATENT DOCUMENTS

| 2013/0187127 A1* | 7/2013 | Yi ..................... H01L 33/007 257/13 |
| 2014/0110663 A1* | 4/2014 | Choi et al. ................. 257/13 |

* cited by examiner

OPTICAL DEVICE AND MANUFACTURE THEREOF

CROSS-REFERENCE TO RELATED APPLICATION

This utility application claims priority to Taiwan Application Serial Number 102142377, filed Nov. 21, 2013, which is incorporated herein by reference.

BACKGROUND OF THE INVENTION

1. Field of the Invention

The invention relates to an optical device and a method of manufacturing the same, and particularly to an optical device with low reflectance for broadband light and being insensitive to incident angle of light and manufacture thereof.

2. Description of the Prior Art

Essential optical devices in various optical systems include, for example, protection covers in photovoltaic systems, light covers in illuminating systems, protection covers in photography systems, and so on. The reflectance of light-entrance surfaces and light-exit surfaces of these optical devices directly affect the effectivity of these systems.

The aforesaid optical devices should have low reflectance for broadband light. The prior art relating to the aforesaid optical devices has used an evaporation process or a sputtering process to repeatedly coat different films to constitute multi-film structures on surfaces of substrates. These multi-film structures all have low reflectance for broadband light. However, these multi-structures all are insensitive to incident angle of light, i.e., these multi-structures all have larger reflectance for the light with larger incident angle.

At present, there is no optical device, which has low reflectance for broadband light and is insensitive to incident angle of light, been developed.

SUMMARY OF THE INVENTION

Accordingly, one scope of the invention is to provide an optical device with low reflectance for broadband light and being insensitive to incident angle of light and manufacture thereof.

An optical device to a preferred embodiment of the invention includes a transparent substrate, a first seeding layer, a plurality of first nano-rods and a first protection layer. The first seeding layer is formed to overlay a light-entrance surface of the transparent substrate. The plurality of first nano-rods are formed on the first seeding layer. The first protection layer is formed to completely overlay the plurality of first nano-rods.

In one embodiment, the plurality of first nano-rods are substantially perpendicular to the light-entrance surface of the transparent substrate.

In another embodiment, the plurality of first nano-rods on the light-entrance surface of the transparent substrate are arranged into a plurality of clusters. Each cluster is composed of some first nano-rods which each tilts in a respective angle with respect to a normal direction of the light-entrance surface.

Further, the optical device of the invention also includes a second seeding layer, a plurality of second nano-rods and a second protection layer. The second seeding layer is formed to overlay a light-exist surface of the transparent substrate. The plurality of second nano-rods are formed on the second seeding layer. The second protection layer is formed to completely overlay the plurality of second nano-rods.

A method of manufacturing an optical device according to a preferred embodiment of the invention, firstly, is to prepare a transparent substrate. Then, the method of the invention is to form a first seeding layer to overlay a light-entrance surface of the transparent substrate. Afterward, the method of the invention is to form a plurality of first nano-rods on the first seeding layer. Finally, the method of the invention is to form a first protection layer to completely overlay the plurality of first nano-rods.

In one embodiment, the first seeding layer is formed of a first oxide, and can be formed by a hydrothermal process, an atomic layer deposition process, a sputtering process, a sol-gel process, an organic chemical vapor deposition process, a chemical vapor deposition process, an electrochemical deposition process, or other deposition process.

In one embodiment, the plurality of first nano-rods are formed of a second oxide, and can be formed by a hydrothermal process, a sol-gel process, an organic chemical vapor deposition process, a chemical vapor deposition process, an electrochemical deposition process, a template process, a vapor-liquid-solid growth process, a vapor transport deposition process, or other deposition process.

Distinguishable from the prior art, the optical device of the invention not only has low reflectance for broadband light, but also is insensitive to incident angle of light The advantage and spirit of the invention may be understood by the following recitations together with the appended drawings.

DETAILED DESCRIPTION OF THE INVENTION

Figure 1:
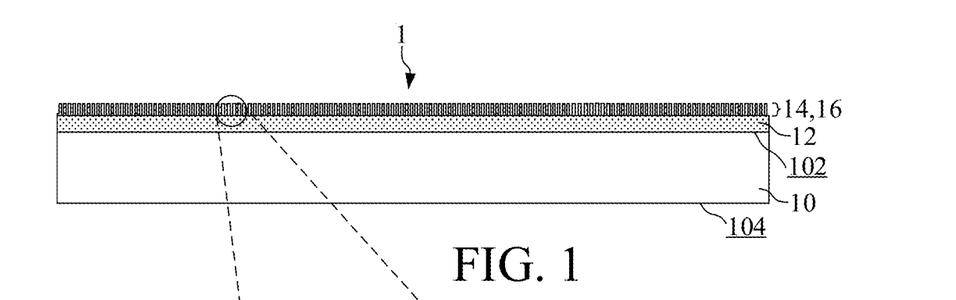
FIG. 1 is a cross-sectional schematic drawing of an optical device according to a preferred embodiment of the invention.
Figure 2:
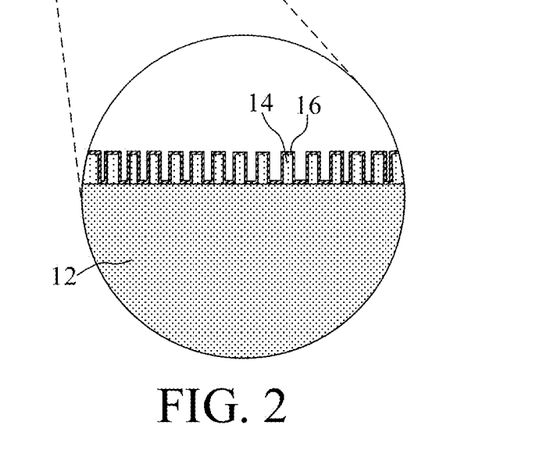
FIG. 2 is a partially enlarged schematic drawing of a boding between the first nano-rods and the first seeding layer shown in FIG. 1.

Referring to FIG. 1 and FIG. 2, FIG. 1 is a cross-sectional schematic drawing showing an optical device 1 according to a preferred embodiment. FIG. 2 is a partially enlarged schematic drawing of a boding between a plurality first nano-rods 14 and a first seeding layers 12 shown in FIG. 1. The optical device 1 of the invention can be, but not limited to, a protection cover in a photovoltaic system, a light cover in an illuminating system, a protection cover in photography system and so on.

As shown in FIG. 1 and FIG. 2, the optical device 1 to the preferred embodiment of the invention includes a transparent substrate 10, the first seeding layer 12, the plurality of first nano-rods 14 and a first protection layer 16. In one embodiment, the transparent substrate 10 can be formed of glass, Acrylic, single crystal (e.g., sapphire etc.).

The first seeding layer 12 is formed to overlay an entrance surface 102 of the transparent substrate 10. The plurality of first nano-rods 14 are formed on the first seeding layer 12. The first protection layer 16 is formed to completely overlay the plurality of first nano-rods 14. Because the scale of the first protection layer 16 is very small, the first protection layer 16 and the plurality of first nano-rods 14 are marked together in FIG. 1. In FIG. 2, it is clear that a gap is formed between one first nano-rod 14 and one adjacent first nano-rod 14 of the first nano-rods 14, the first protection layer 16 completely overlays the surface of the plurality of first nano-rods 14, find the first protection layer 16 is formed along the plurality of first nano-rods 14 and the exposed first seeding layer 12 without filling said gap between said one first nano-rod 14 and said one adjacent first nano-rod 14.

The first seeding layer 12 assists in uniform distribution of the first nano-rods 14 subsequently formed on the first seeding layer 12. If there is no first seeding layer 12 previously formed, the first nano-rods 14 directly formed on the light-entrance surface 102 of the transparent substrate 10 will distribute non-uniformly, and even there is no first nano-rods 14 formed on some regions of the light-entrance surface 102 of the transparent substrate 10.

Figure 3:
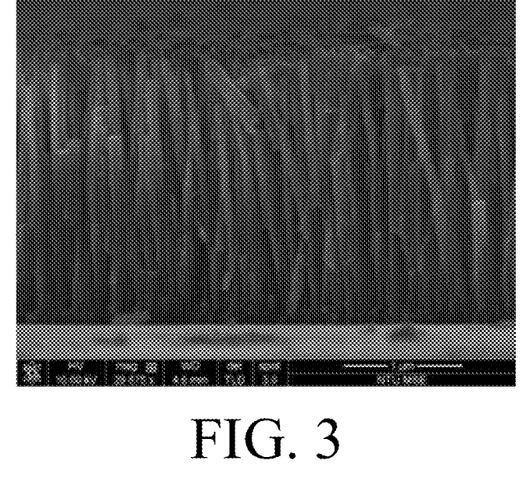
FIG. 3 is an SEM photograph of an optical device of an example of the invention in a side view.
Figure 4:
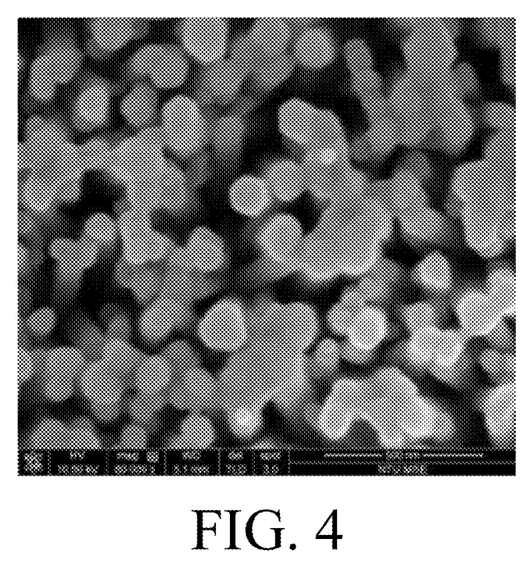
FIG. 4 is an SEM photograph of an optical device of an example of the invention in a top view.

Referring to FIG. 3 and FIG. 4, these pictures are SEM photographs of an optical device of an example of the invention to show the structure of the plurality of first nano-rods 14. In the example shown in FIG. 3 and FIG. 4, the plurality of first nano-rods 14 are formed of ZnO. FIG. 3 is the side view of the first nano-rods 14. FIG. 4 is the top view of the first nano-rods 14. FIG. 3 and FIG. 4 confirm that the first nano-rods 14 of the invention have high ratio of height to outer diameter. In practical application, the plurality of first nano-rods 14 have a ratio of height to outer diameter in a range of from 1 to 100. That is to say that the plurality of first nano-rods 14 have high ratio of depth to width inherently. By the first nano-rods 14 inherently having high ratio of depth to width, the optical device 1 of the invention is insensitive to incident angle of light. The reflectance of the optical device 1 of the invention for a broadband light will hereinafter be described by actual test data.

In one embodiment, the plurality of first nano-rods 14 are substantially perpendicular to the light-entrance surface 102 of the transparent substrate 10.

In another embodiment, the plurality of first nano-rods 14 on the light-entrance surface 102 of the transparent substrate 10 are arranged into a plurality of clusters. Each cluster is composed of some first nano-rods 14 which each tilts in a respective angle with respect to a normal direction of the light-entrance surface 102.

In one embodiment, the first seeding layer 12 is formed of a first oxide. The first oxide can be $Al_2O_3$, $Al_xTi_yO_z$, $Al_xCr_yO_z$, $Al_xZr_yO_z$, $Al_xHf_yO_z$, $Al_xSi_yO_z$, $B_2O_3$, $B_xP_yO_z$, $BiO_x$, $Bi_xTi_yO_z$, $BaTiO_3$, CaO, CoO, $CoO_x$, $Co_3O_4$, $CrO_x$, $CeO_2$, $Cu_2O$, CuO, FeO, $FeO_x$, Ga2O3, GeO2, $HfO_2$, $In_2O_3$, $LaAlO_3$, $La_2O_3$, $La_2CoO_3$, $La_2NiO_3$, $La_2MnO_3$, MoN, $Mo_2N$, $Mo_xN$, $MoO_2$, MgO, $MnO_x$, NiO, $Nb_2O_5$, $PtO_2$, $P_xB_yO_z$, RuO, $Sc_2O_3$, $SiO_2$, $Si_xTi_yO_z$, $Si_xZr_yO_z$, $Si_xHf_yO_z$, $SnO_2$, $Sb_2O_5$, SrO, $SrCO_3$, $SrTiO_3$, $Ta_2O_5$, $TaO_xN_y$, $Ti_xZr_yO_z$, $TiO_2$, $Ti_xHf_yO_z$, $VO_x$, $WO_3$, $Y_2O_3$, ZnO, $ZrO_2$, $PrO_x$, $Nd_2O_3$, $Sm_2O_3$, $Eu_2O_3$, $Gd_2O_3$, $Dy_2O_3$, $Ho_2O_3$, $Er_2O_3$, $Tm_2O_3$, $Lu_2O_3$, or a mixture therebetween, where $0 \leq x \leq 1$, $0 \leq y \leq 1$, $0 \leq z \leq 1$.

In one embodiment, the plurality of first anno-rods 14 are formed of a second oxide. The second oxide can be $Al_2O_3$, $Al_xTi_yO_z$, $Al_xCr_yO_z$, $Al_xZr_yO_z$, $Al_xHf_yO_z$, $Al_xSi_yO_z$, $B_2O_3$, $B_xP_yO_z$, $BiO_x$, $Bi_xTi_yO_z$, $BaTiO_3$, CaO, CoO, $CoO_x$, $Co_3O_4$, $CrO_x$, $CeO_2$, $Cu_2O$, CuO, FeO, $FeO_x$, Ga2O3, GeO2, $HfO_2$, $In_2O_3$, $LaAlO_3$, $La_2O_3$, $La_2CoO_3$, $La_2NiO_3$, $La_2MnO_3$, MoN, $Mo_2N$, $Mo_xN$, $MoO_2$, MgO, $MnO_x$, NiO, $Nb_2O_5$, $PtO_2$, $P_xB_yO_z$, RuO, $Sc_2O_3$, $SiO_2$, $Si_xTi_yO_z$, $Si_xZr_yO_z$, $Si_xHf_yO_z$, $SnO_2$, $Sb_2O_5$, SrO, $SrCO_3$, $SrTiO_3$, $Ta_2O_5$, $TaO_xN_y$, $Ti_xZr_yO_z$, $TiO_2$, $Ti_xHf_yO_z$, $VO_x$, $WO_3$, $Y_2O_3$, ZnO, $ZrO_2$, $PrO_x$, $Nd_2O_3$, $Sm_2O_3$, $Eu_2O_3$, $Gd_2O_3$, $Dy_2O_3$, $Ho_2O_3$, $Er_2O_3$, $Tm_2O_3$, $Lu_2O_3$, or a mixture therebetween, where $0 \leq x \leq 1$, $0 \leq y \leq 1$, $0 \leq z \leq 1$.

In one embodiment, the first protection layer 16 is formed of $Al_2O_3$, AlN, AlP, AlAs, $Al_xTi_yO_z$, $Al_xCr_yO_z$, $Al_xZr_yO_z$, $Al_xHf_yO_z$, $Al_xSi_yO_z$, $B_2O_3$, BN, $B_xP_yO_z$, $BiO_x$, $Bi_xTi_yO_z$, BaS, $BaTiO_3$, CdS, CdSe, CdTe, CaO, CaS, $CaF_2$, $CuGaS_2$, CoO, $CoO_x$, $Co_3O_4$, $CrO_x$, $CeO_2$, $Cu_2O$, CuO, $Cu_xS$, FeO, $FeO_x$, GaN, GaAs, GaP, $Ga_2O_3$, $GeO_2$, $HfO_2$, $Hf_3N_4$, HgTe, InP, InAs, $In_2O_3$, $In_2S_3$, InN, InSb, $LaAlO_3$, $La_2S_3$, $La_2O_2S$, $La_2O_3$, $La_2CoO_3$, $La_2NiO_3$, $La_2MnO_3$, MoN, $Mo_2N$, $Mo_xN$, $MoO_2$, MgO, $MnO_x$, MnS, NiO, NbN, $Nb_2O_5$, PbS, $PtO_2$, $PO_x$, $P_xB_yO_z$, RuO, $Sc_2O_3$, $Si_3N_4$, $SiO_2$, SiC, $Si_xTi_yO_z$, $Si_xZr_yO_z$, $Si_xHf_yO_z$, $SnO_2$, $Sb_2O_5$, SrO, $SrCO_3$, $SrTiO_3$, SrS, $SrS_{1-x}Se_x$, $SrF_2$, $Ta_2O_5$, $TaO_xN_y$, $Ta_3N_5$, TaN, $TaN_x$, $Ti_xZr_yO_z$, $TiO_2$, TiN, $Ti_xSi_yN_z$, $Ti_xHf_yO_z$, $VO_x$, $WO_3$, $W_2N$, $W_xN$, $WS_2$, WXC, $Y_2O_3$, $Y_2O_2S$, $ZnS_{1-x}Se_x$, ZnO, ZnS, ZnSe, ZnTe, $ZnF_2$, $ZrO_2$, $Zr_3N_4$, $PrO_x$, $Nd_2O_3$, $Sm_2O_3$, $Eu_2O_3$, $Gd_2O_3$, $Dy_2O_3$, $Ho_2O_3$, $Er_2O_3$, $Tm_2O_3$, $Lu_2O_3$, or a mixture therebetween, where $0 \leq x \leq 1$, $0 \leq y \leq 1$, $0 \leq z \leq 1$. Due to weak resistance of the first nano-rods 14 of oxide to environmental attack, the first protection layer 16 of aforesaid materials can effectively prevent the first nano-rods 14 of oxide from environmental attack. At the same time, the first protection layer 16 can further lower the reflectance of the optical device 1 for the broadband light.

Figure 5:
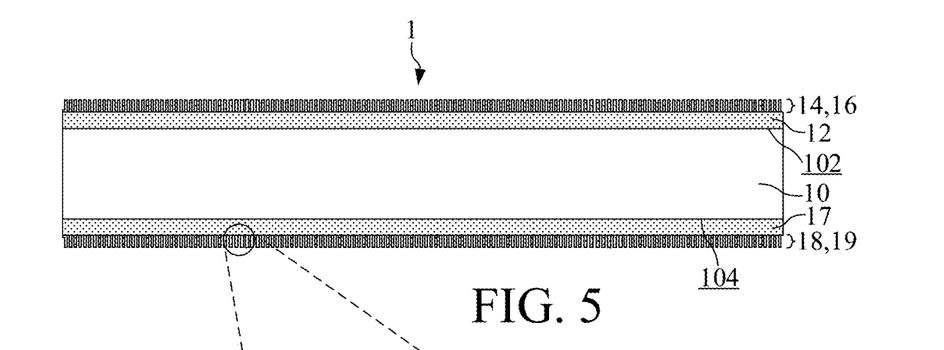
FIG. 5 is a cross-sectional schematic drawing of an optical device according to a modification of the invention.
Figure 6:
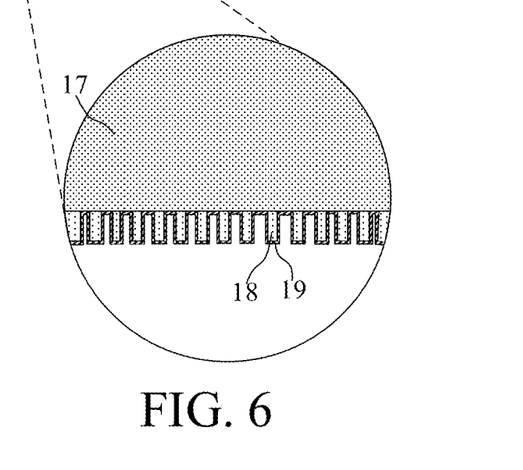
FIG. 6 is a partially enlarged schematic drawing of a boding between the second nano-rods and the first seeding layer shown in FIG. 1.

Further, as shown in FIG. 5 and FIG. 6, the optical device 1 of the invention also includes a second seeding layer 17, a plurality of second nano-rods 18 and a second protection layer 19. The second seeding layer 17 is formed to overlay a light-exit surface 104 of the transparent substrate 10. The plurality of second nano-rods 18 are formed on the second seeding layer 17. The second protection layer 19 is formed to completely overlay the plurality of second nano-rods 18. The second seeding layer 17 assists in uniform distribution of the second nano-rods 18 subsequently formed on the second seeding layer 17. The components and devices in FIG. 5 and FIG. 6 identical to those shown in FIG. 1 and FIG. 2 are given the same numerical notations, and will be not described in detail herein. In practical application, the composition of the second seeding layer 17 and that of the first seeding layer 12 are the same. The composition of the second nano-rods 18 and that of the first nano-rods 14 are the same. The composition of the second protection layer 19 and that of the first protection layer 16 are the same. By the second nano-rods 18, the haze of light exiting from the optical device 1 of the invention can be enhanced significantly.

Figure 7:
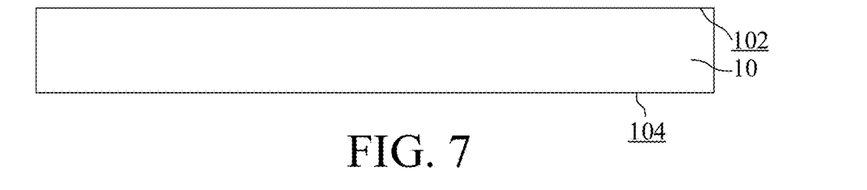
FIGS. 7 through 9 illustratively show a method of manufacturing an optical device according to a preferred embodiment of the invention with cross-sectional schematic drawings.
Figure 8:
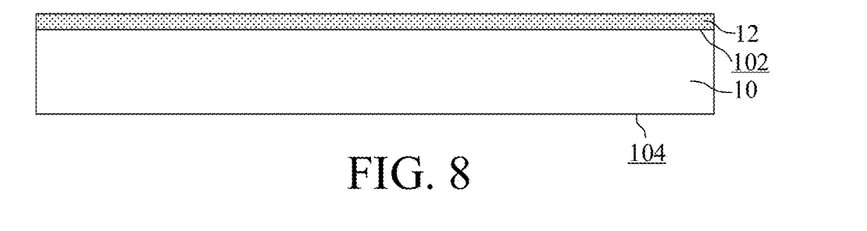
Figure 9:
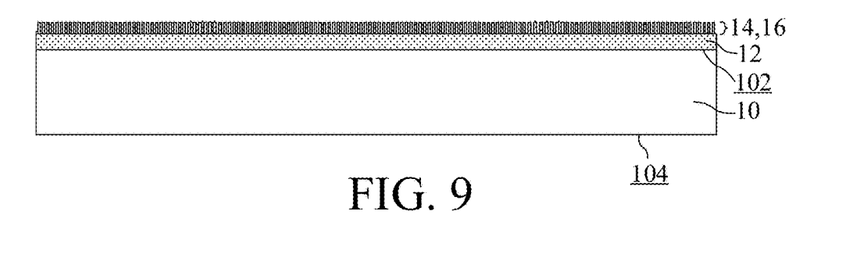

Referring to FIGS. 7 through 9, these cross-sectional schematic drawings illustratively show a method of manufacturing an optical device 1 according to a preferred embodiment of the invention.

Firstly, as shown in FIG. 7, the method of the invention, is to prepare a transparent substrate 10. In one embodiment, the transparent substrate 10 can be formed of glass, Acrylic, single crystal (e.g., sapphire etc.).

Then, as shown in FIG. 8, the method of the invention is to form a first seeding layer 12 to overlay a light-entrance surface 102 of the transparent substrate 10.

In one embodiment, the first seeding layer 12 is formed of a first oxide, and can be formed by a hydrothermal process, an atomic layer deposition process, a sputtering process, a sol-gel process, an organic chemical vapor deposition process, a chemical vapor deposition process, an electrochemical deposition process, or other deposition process.

In one embodiment, the first seeding layer 12 is formed of a first oxide. The first oxide can be $Al_2O_3$, $Al_xTi_yO_z$, $Al_xCr_yO_z$, $Al_xZr_yO_z$, $Al_xHf_yO_z$, $Al_xSi_yO_z$, $B_2O_3$, $B_xP_yO_z$, $BiO_x$, $Bi_xTi_yO_z$, $BaTiO_3$, $CaO$, $CoO$, $CoO_x$, $CO_3O_4$, $CrO_x$, $CeO_2$, $Cu_2O$, $CuO$, $FeO$, $FeO_x$, $Ga2O3$, $GeO2$, $HfO_2$, $In_2O_3$, $LaAlO_3$, $La_2O_3$, $La_2CoO_3$, $La_2NiO_3$, $La_2MnO_3$, $MoN$, $Mo_2N$, $Mo_xN$, $MoO_2$, $MgO$, $MnO_x$, $NiO$, $Nb_2O_5$, $PtO_2$, $P_xB_yO_z$, $RuO$, $Sc_2O_3$, $SiO_2$, $Si_xTi_yO_z$, $Si_xZr_yO_z$, $Si_xHf_yO_z$, $SnO_2$, $Sb_2O_5$, $SrO$, $SrCO_3$, $SrTiO_3$, $Ta_2O_5$, $TaO_xN_y$, $Ti_xZr_yO_z$, $TiO_2$, $Ti_xHf_yO_z$, $VO_x$, $WO_3$, $Y_2O_3$, $ZnO$, $ZrO_2$, $PrO_x$, $Nd_2O_3$, $Sm_2O_3$, $Eu_2O_3$, $Gd_2O_3$, $Dy_2O_3$, $Ho_2O_3$, $Er_2O_3$, $Tm_2O_3$, $Lu_2O_3$, or a mixture therebetween, where $0 \leq x \leq 1$, $0 \leq y \leq 1$, $0 \leq z \leq 1$.

Afterward, as shown in FIG. 9, the method of the invention is to form a plurality of first nano-rods 14 on the first seeding layer 12. The first seeding layer 12 assists in uniform distribution of the first nano-rods 14 subsequently formed on the first seeding layer 12.

Finally, also as shown in FIG. 9, the method of the invention is to form a first protection layer 16 to completely overlay the plurality of first nano-rods 14. Because the scale of the first protection layer 16 is very small, the first protection layer 16 and the plurality of first nano-rods 14 are marked together in FIG. 9.

In one embodiment, the plurality of first anno-rods 14 are formed of a second oxide. The second oxide can be $Al_2O_3$, $Al_xTi_yO_z$, $Al_xCr_yO_z$, $Al_xZr_yO_z$, $Al_xHf_yO_z$, $Al_xSi_yO_z$, $B_2O_3$, $B_xP_yO_z$, $BiO_x$, $Bi_xTi_yO_z$, $BaTiO_3$, $CaO$, $CoO$, $CoO_x$, $CO_3O_4$, $CrO_x$, $CeO_2$, $Cu_2O$, $CuO$, $FeO$, $FeO_x$, $Ga2O3$, $GeO2$, $HfO_2$, $In_2O_3$, $LaAlO_3$, $La_2O_3$, $La_2CoO_3$, $La_2NiO_3$, $La_2MnO_3$, $MoN$, $Mo_2N$, $Mo_xN$, $MoO_2$, $MgO$, $MnO_x$, $NiO$, $Nb_2O_5$, $PtO_2$, $P_xB_yO_z$, $RuO$, $Sc_2O_3$, $SiO_2$, $Si_xTi_yO_z$, $Si_xZr_yO_z$, $Si_xHf_yO_z$, $SnO_2$, $Sb_2O_5$, $SrO$, $SrCO_3$, $SrTiO_3$, $Ta_2O_5$, $TaO_xN_y$, $Ti_xZr_yO_z$, $TiO_2$, $Ti_xHf_yO_z$, $VO_x$, $WO_3$, $Y_2O_3$, $ZnO$, $ZrO_2$, $PrO_x$, $Nd_2O_3$, $Sm_2O_3$, $Eu_2O_3$, $Gd_2O_3$, $Dy_2O_3$, $Ho_2O_3$, $Er_2O_3$, $Tm_2O_3$, $Lu_2O_3$, or a mixture therebetween, where $0 \leq x \leq 1$, $0 \leq y \leq 1$, $0 \leq z \leq 1$.

In one embodiment, the plurality of first nano-rods are formed of a second oxide, and can be formed by a hydrothermal process, a sol-gel process, an organic chemical vapor deposition process, a chemical vapor deposition process, an electrochemical deposition process, a template process, a vapor-liquid-solid growth process, a vapor transport deposition process, or other deposition process.

In one embodiment, the first protection layer 16 can be formed of $Al_2O_3$, $AlN$, $AlP$, $AlAs$, $Al_xTi_yO_z$, $Al_xCr_yO_z$, $Al_xZr_yO_z$, $Al_xHf_yO_z$, $Al_xSi_yO_z$, $B_2O_3$, $BN$, $B_xP_yO_z$, $BiO_x$, $Bi_xTi_yO_z$, $BaS$, $BaTiO_3$, $CdS$, $CdSe$, $CdTe$, $CaO$, $CaS$, $CaF_2$, $CuGaS_2$, $CoO$, $CoO_x$, $Co_3O_4$, $CrO_x$, $CeO_2$, $Cu_2O$, $CuO$, $Cu_xS$, $FeO$, $FeO_x$, $GaN$, $GaAs$, $GaP$, $Ga_2O_3$, $GeO_2$, $HfO_2$, $Hf_3N_4$, $HgTe$, $InP$, $InAs$, $In_2O_3$, $In_2S_3$, $InN$, $InSb$, $LaAlO_3$, $La_2S_3$, $La_2O_2S$, $La_2O_3$, $La_2CoO_3$, $La_2NiO_3$, $La_2MnO_3$, $MoN$, $Mo_2N$, $Mo_xN$, $MoO_2$, $MgO$, $MnO_x$, $MnS$, $NiO$, $NbN$, $Nb_2O_5$, $PbS$, $PtO_2$, $PO_x$, $P_xB_yO_z$, $RuO$, $Sc_2O_3$, $Si_3N_4$, $SiO_2$, $SiC$, $Si_xTi_yO_z$, $Si_xZr_yO_z$, $Si_xHf_yO_z$, $SnO_2$, $Sb_2O_5$, $SrO$, $SrCO_3$, $SrTiO_3$, $SrS$, $SrS_{1-x}Se_x$, $SrF_2$, $Ta_2O_5$, $TaO_xN_y$, $Ta_3N_5$, $TaN$, $TaN_x$, $Ti_xZr_yO_z$, $TiO_2$, $TiN$, $Ti_xSi_yN_z$, $Ti_xHf_yO_z$, $VO_x$, $WO_3$, $W_2N$, $W_xN$, $WS_2$, $WXC$, $Y_2O_3$, $Y_2O_2S$, $ZnS_{1-x}Se_x$, $ZnO$, $ZnS$, $ZnSe$, $ZnTe$, $ZnF_2$, $ZrO_2$, $Zr_3N_4$, $PrO_x$, $Nd_2O_3$, $Sm_2O_3$, $Eu_2O_3$, $Gd_2O_3$, $Dy_2O_3$, $Ho_2O_3$, $Er_2O_3$, $Tm_2O_3$, $Lu_2O_3$, or a mixture therebetween, where $0 \leq x \leq 1$, $0 \leq y \leq 1$, $0 \leq z \leq 1$. Due to weak resistance of the first nano-rods 14 of oxide to environmental attack, the first protection layer 16 of aforesaid materials can effectively protect the first nano-rods 14 of oxide from environmental attack. At the same time, the first protection layer 16 can further lower the reflectance of the optical device 1 for the broadband light.

In practical application, the plurality of first nano-rods 14 have a ratio of height to outer diameter in a range of from 1 to 100. That is to say that the plurality of first nano-rods 14 have high ratio of depth to width inherently.

In one embodiment, the first protection layer 16 can be formed by an atomic layer deposition process. Due to high ratio of depth to width of the first nano-rods 14, the first protection layer 16 cannot completely overlay the first nano-rods 14 by a general deposition process. The chemical reactions proceed only at the surface of the first nano-rods 14 during the atomic layer deposition process, leading to self-limiting and layer-by-layer growth. Therefore, the first protection layer 16 can completely overlay the first nano-rods 14 by an atomic layer deposition process. The atomic layer deposition process adopted by the invention has the following advantages: (1) the ability to control the formation of the material in atomic scale; (2) the ability to control the film thickness more precisely; (3) the ability to control the composition more precisely; (4) excellent uniformity; (5) excellent conformality and step coverage; (6) pinhole-free structure and low defect density; (7) mass production with large-area and large-batch capacity; and (8) low deposition temperatures, etc.

Figure 10:
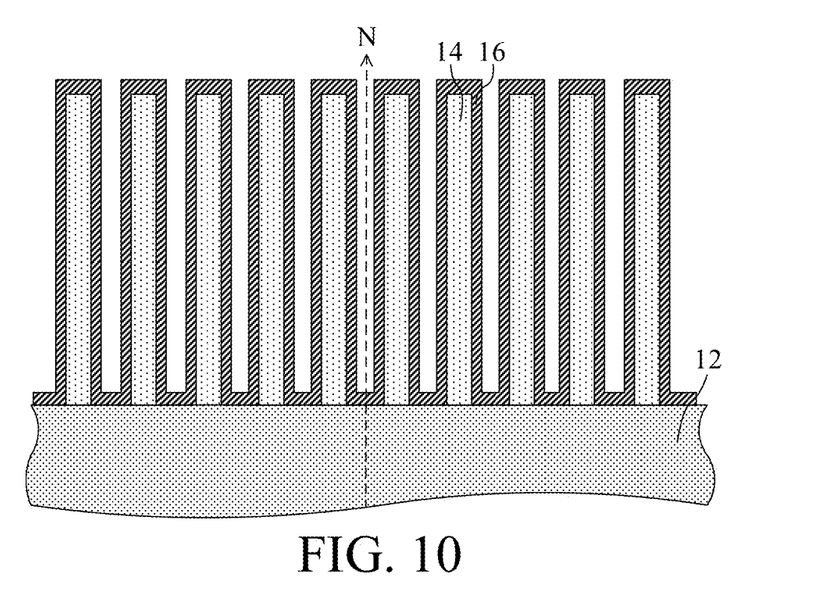
FIG. 10 is a schematic side drawing showing the well-aligned first nano-rods of the invention.
Figure 11:
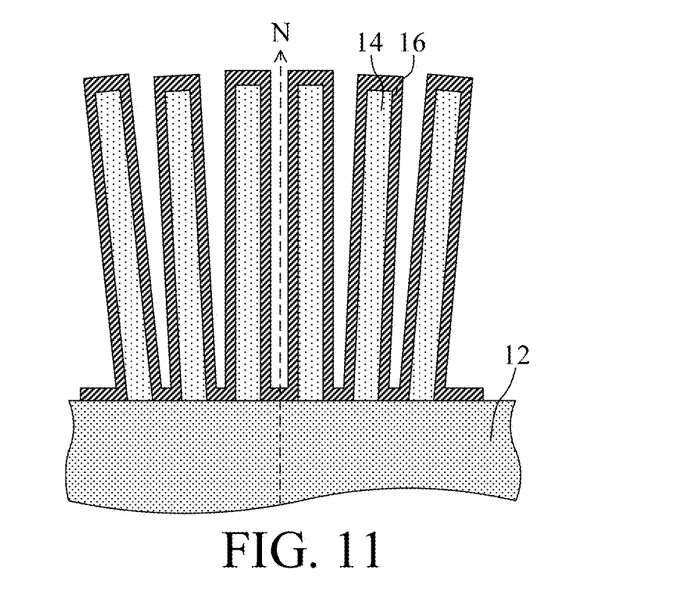
FIG. 11 is a schematic side drawing showing the quasi-aligned first nano-rods of the invention.
Figure 12:
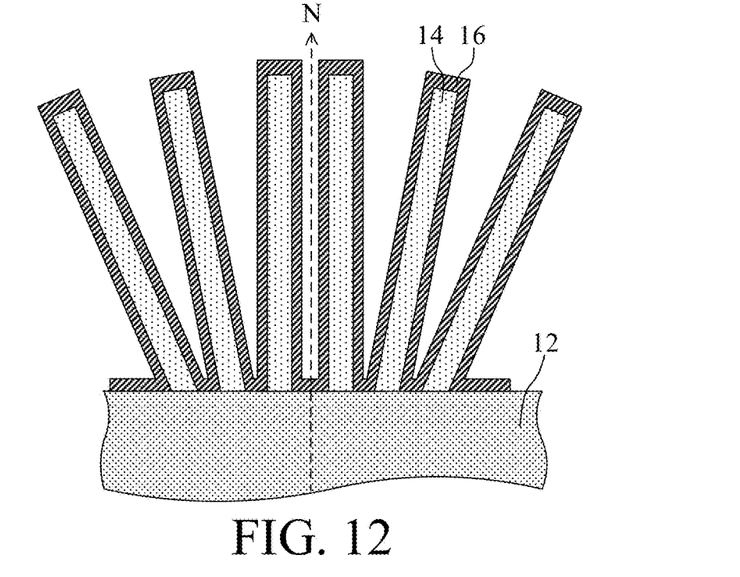
FIG. 12 is a schematic side drawing showing the flower-like first nano-rods of the invention.

Referring to FIG. 10, FIG. 11 and FIG. 12, these schematic side drawings show the structures of the first nano-rods 12 of three examples of the invention. In FIG. 10 to FIG. 12, only portion of the first seeding layer 12 and a normal direction N of the transparent substrate 10 are illustrated. In the example shown in FIG. 10, the plurality of first nano-rods 14 are substantially perpendicular to the light-entrance surface 102 of the transparent substrate 10, i.e., perpendicular to the normal direction N of the transparent substrate 10. Herein, the first nano-rods 14 as shown in FIG. 10 are called as the well-aligned first nano-rods 14. In the example shown in FIG. 11, the plurality of first nano-rods 14 on the light-entrance surface 102 of the transparent substrate 10 are arranged into a plurality of clusters, and each cluster is composed of some first nano-rods 14 which each tilts in a respective angle with respect to the normal direction N of the light-entrance surface 102. In the cluster shown in FIG. 11, the tilted angles of the first nano-rods 14 are small. Herein, the first nano-rods 14 as shown in FIG. 11 are called as the quasi-aligned first nano-rods 14. The arrangement of the first nano-rods 14 shown in the example of FIG. 12 is similar to that of the first nano-rods 14 shown in the example of FIG. 11. Different from the example shown in FIG. 11, in the cluster shown in FIG. 12, the tilted angles of the first nano-rods 14 are larger so that each cluster of the first nano-rods 14 is like a blooming flower. Herein, the first nano-rods 14 as shown in FIG. 12 are called as the flower-like first nano-rods 14.

Figure 13:
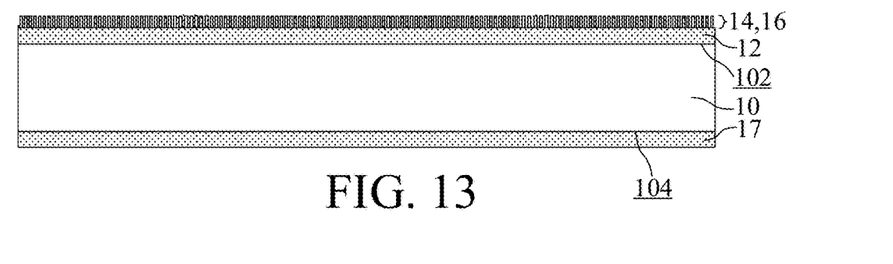
FIGS. 13 and 14 illustratively show the further steps of the method of manufacturing the optical device according to the invention with cross-sectional schematic drawings.
Figure 14:
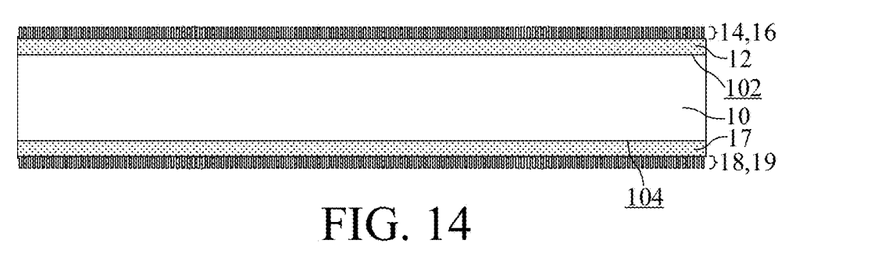

Referring to FIGS. 13 through 14, these cross-sectional schematic drawings illustratively show the further steps of the method of manufacturing the optical device 1 according to the invention.

Further, as shown in FIG. 13, the method of the invention is to form a second seeding layer 17 to overlay a light-exit surface 104 of the transparent substrate 10.

Further, as shown in FIG. 14, the method of the invention is to form a plurality of second nano-rods 18 on the second seeding layer 18. The second seeding layer 17 assists in uniform distribution of the second nano-rods 18 subsequently formed on the second seeding layer 17.

Finally, also as shown in FIG. 14, the method of the invention is to a second protection layer 19 to completely overlay the plurality of second nano-rods 18. By the second nano-rods 18, the haze of light exiting from the optical device 1 of the invention can be enhanced significantly.

In practical application, the composition and manufacture process of the second seeding layer 17 and those of the first seeding layer 12 are the same. The composition and manufacture process of the second nano-rods 18 and those of the first nano-rods 14 are the same. The composition and manufacture process of the second protection layer 19 and those of the first protection layer 16 are the same. The second protective layer 19 and the first protective layer 16 may even be simultaneously formed with the same atomic layer deposition process, to reduce manufacturing cost. In addition, the second seeding layer 17 and the first seeding layer 12 may be simultaneously formed with the same process, to reduce manufacturing cost.

Figure 15:
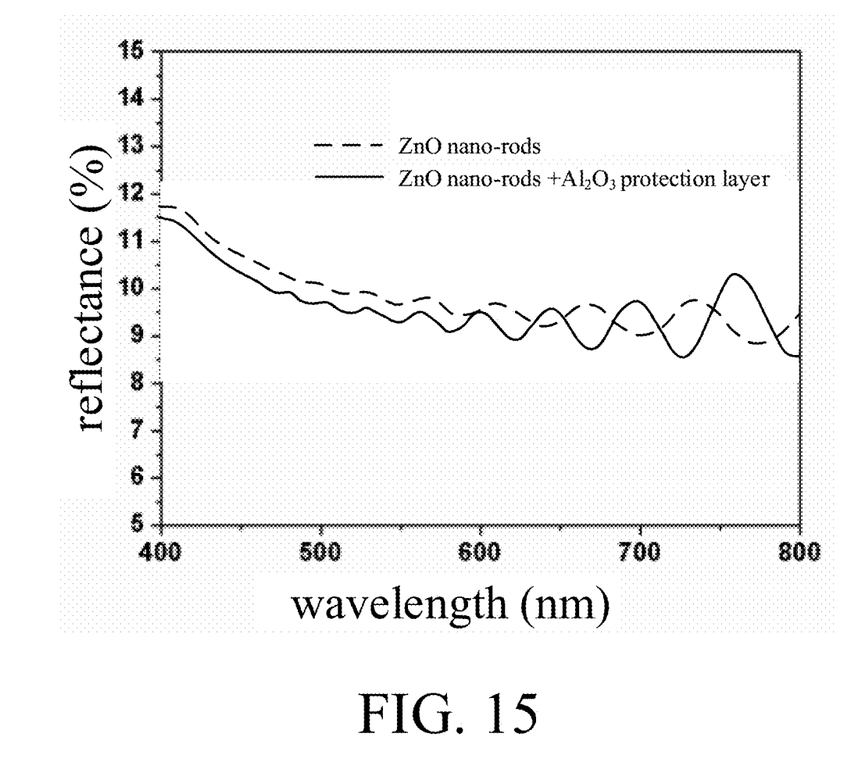
FIG. 15 shows the measured reflectance of ZnO first nano-rods of an example of the invention for a broadband light.

Referring to FIG. 15, FIG. 15 shows the measured reflectance of ZnO first nano-rods 14 of an example of the invention for a broadband light. In FIG. 15, the measured reflectance of ZnO first nano-rods 14 further overlaid by 12 nm $Al_2O_3$ first protection layer is also shown. The measured results of FIG. 15 confirm that the optical device 1 of the invention with the ZnO first nano-rods 14 has low reflectance for the broadband light. The $Al_2O_3$ first protective layer 16 can further reduce the reflectance of the optical device 1 of the invention for the broadband light.

With the example and explanations above, the features and spirits of the invention will be hopefully well described. Those skilled in the art will readily observe that numerous modifications and alterations of the device may be made while retaining the teaching of the invention. Accordingly, the above disclosure should be construed as limited only by the metes and bounds of the appended claims.

What is claimed is:

1. An optical device, comprising:
   a transparent substrate;
   a first seeding layer, formed to overlay a light-entrance surface of the transparent substrate;
   a plurality of first nano-rods, formed on the first seeding layer, wherein a portion of the first seeding layer is exposed, a gap is formed between one first nano-rod and one adjacent first nano-rod of the first nano-rods; and
   a first protection layer formed to completely overlay the plurality of first nano-rods and the exposed portion of the first seeding layer, wherein the first protection layer is exposed, the first protection layer is formed along the plurality of first nano-rods and the exposed first seeding layer without filling the gap between said one first nano-rod and said one adjacent first nano-rod.

2. The optical device of claim 1, wherein the plurality of first nano-rods have a ratio of height to outer diameter in a range of from 1 to 100.

3. The optical device of claim 1, wherein the plurality of first nano-rods are located away from the light-entrance surface of the transparent substrate and arranged into a plurality of clusters, and each cluster is composed of some first nano-rods which each tilts in a respective angle with respect to a normal direction of the light-entrance surface.

4. The optical device of claim 1, wherein the plurality of first nano-rods are substantially perpendicular to the light-entrance surface of the transparent substrate.

5. The optical device of claim 1, wherein the first seeding layer is formed of a first oxide, and the plurality of first nano-rods are formed of a second oxide.

6. The optical device of claim 5, wherein the first oxide and the second oxide are respectively one selected from the group consisting of $Al_2O_3$, $Al_xTi_yO_z$, $Al_xCr_yO_z$, $Al_xZr_yO_z$, $Al_xHf_yO_z$, $Al_xSi_yO_z$, $B_2O_3$, $B_xP_yO_z$, $BiO_x$, $Bi_xTi_yO_z$, $BaTiO_3$, $CaO$, $CoO$, $CoO_x$, $Co_3O_4$, $CrO_x$, $CeO_2$, $Cu_2O$, $CuO$, $FeO$, $FeO_x$, $Ga2O3$, $GeO2$, $HfO_2$, $In_2O_3$, $LaAlO_3$, $La_2O_3$, $La_2CoO_3$, $La_2NiO_3$, $La_2MnO_3$, $MoN$, $Mo_2N$, $Mo_xN$, $MoO_2$, $MgO$, $MnO_x$, $NiO$, $Nb_2O_5$, $PtO_2$, $P_xB_yO_z$, $RuO$, $Sc_2O_3$, $SiO_2$, $Si_xTi_yO_z$, $Si_xZr_yO_z$, $Si_xHf_yO_z$, $SnO_2$, $Sb_2O_5$, $SrO$, $SrCO_3$, $SrTiO_3$, $Ta_2O_5$, $TaO_xN_y$, $Ti_xZr_yO_z$, $TiO_2$, $Ti_xHf_yO_z$, $VO_x$, $WO_3$, $Y_2O_3$, $ZnO$, $ZrO_2$, $PrO_x$, $Nd_2O_3$, $Sm_2O_3$, $Eu_2O_3$, $Gd_2O_3$, $Dy_2O_3$, $Ho_2O_3$, $Er_2O_3$, $Tm_2O_3$, $Lu_2O_3$ and a mixture therebetween, $0 \leq x \leq 1$, $0 \leq y \leq 1$, $0 \leq z \leq 1$.

7. The optical device of claim 1, wherein the first protection layer is formed of one selected from the group consisting of $Al_2O_3$, $AlN$, $AlP$, $AlAs$, $Al_xTi_yO_z$, $Al_xCr_yO_z$, $Al_xZr_yO_z$, $Al_xHf_yO_z$, $Al_xSi_yO_z$, $B_2O_3$, $BN$, $B_xP_yO_z$, $BiO_x$, $Bi_xTi_yO_z$, $BaS$, $BaTiO_3$, $CdS$, $CdSe$, $CdTe$, $CaO$, $CaS$, $CaF_2$, $CuGaS_2$, $CoO$, $CoO_x$, $Co_3O_4$, $CrO_x$, $CeO_2$, $Cu_2O$, $CuO$, $Cu_xS$, $FeO$, $FeO_x$, $GaN$, $GaAs$, $GaP$, $Ga_2O_3$, $GeO_2$, $HfO_2$, $Hf_3N_4$, $HgTe$, $InP$, $InAs$, $In_2O_3$, $In_2S_3$, $InN$, $InSb$, $LaAlO_3$, $La_2S_3$, $La_2O_2S$, $La_2O_3$, $La_2CoO_3$, $La_2NiO_3$, $La_2MnO_3$, $MoN$, $Mo_2N$, $Mo_xN$, $MoO_2$, $MgO$, $MnO_x$, $MnS$, $NiO$, $NbN$, $Nb_2O_5$, $PbS$, $PtO_2$, $PO_x$, $P_xB_yO_z$, $RuO$, $Sc_2O_3$, $Si_3N_4$, $SiO_2$, $SiC$, $Si_xTi_yO_z$, $Si_xZr_yO_z$, $Si_xHf_yO_z$, $SnO_2$, $Sb_2O_5$, $SrO$, $SrCO_3$, $SrTiO_3$, $SrS$, $SrS_{1-x}Se_x$, $SrF_2$, $Ta_2O_5$, $TaO_xN_y$, $Ta_3N_5$, $TaN$, $TaN_x$, $Ti_xZr_yO_z$, $TiO_2$, $TiN$, $Ti_xSi_yN_z$, $Ti_xHf_yO_z$, $VO_x$, $WO_3$, $W_2N$, $W_xN$, $WS_2$, $WXC$, $Y_2O_3$, $Y_2O_2S$, $ZnS_{1-x}Se_x$, $ZnO$, $ZnS$, $ZnSe$, $ZnTe$, $ZnF_2$, $ZrO_2$, $Zr_3N_4$, $PrO_x$, $Nd_2O_3$, $Sm_2O_3$, $Eu_2O_3$, $Gd_2O_3$, $Dy_2O_3$, $Ho_2O_3$, $Er_2O_3$, $Tm_2O_3$, $Lu_2O_3$ and a mixture therebetween, $0 \leq x \leq 1$, $0 \leq y \leq 1$, $0 \leq z \leq 1$.

8. An optical device, comprising:
   a transparent substrate;
   a first seeding layer, formed to overlay a light-entrance surface of the transparent substrate;
   a plurality of first nano-rods, formed on the first seeding layer, wherein a portion of the first seeding layer is exposed; and
   a first protection layer from to completely overlay the plurality of first nano-rods and the exposed portion of the first seeding layer, wherein the first protection layer is exposed;
   a second seeding layer, formed to overlay a light-exit surface of the transparent substrate;

a plurality of second nano-rods, formed on the second seeding layer, wherein a portion of the second seeding layer is exposed; and a second protection layer, formed to completely overlay the plurality of second nano-rods and the exposed portion of the second seeding layer, wherein the second protection layer is exposed.

9. A method of manufacturing an optical device, comprising the steps of:

preparing a transparent substrate;

forming a first seeding layer to overlay an entrance surface of the transparent substrate;

forming a plurality of first nano-rods on the first seeding layer wherein a portion of the first seeding layer is exposed, a gap is formed between one first nano-rod and one adjacent first nano-rod of the first nano-rods; and forming a first protection layer to completely overlay the plurality of first nano-rods and the exposed portion of the first seeding layer, wherein the first protection layer is exposed, the first protection layer is formed along the plurality of first nano-rods and the exposed first seeding layer without filling the gap between said one first nano-rod and said one adjacent first nano-rod.

10. The method of claim 9, wherein the plurality of first nano-rods have a ratio of height to outer diameter in a range of from 1 to 100.

11. The method of claim 9, wherein the plurality of first nano-rods on the entrance surface of the transparent substrate are arranged into a plurality of clusters, each cluster is composed of some first nano-rods which each tilts in a respective angle with respect to a normal direction of the entrance surface.

12. The method of claim 9, wherein the plurality of first nano-rods are substantially perpendicular to the entrance surface of the transparent substrate.

13. The method of claim 9, wherein the first seeding layer is formed of a first oxide, and formed by one selected from the group consisting of a hydrothermal process, an atomic layer deposition process, a sputtering process, a sol-gel process, an organic chemical vapor deposition process, a chemical vapor deposition process and an electrochemical deposition process.

14. The method of claim 13, wherein the plurality of first nano-rods are formed of a second oxide, and formed by one selected from the group consisting of a hydrothermal process, a sol-gel process, an organic chemical vapor deposition process, a chemical vapor deposition process, an electrochemical deposition process, a template process, a vapor-liquid-solid growth process and a vapor transport deposition process.

15. The method of claim 14, wherein the first oxide and the second oxide are respectively one selected from the group consisting of $Al_2O_3$, $Al_xTi_yO_z$, $Al_xCr_yO_z$, $Al_xZr_yO_z$, $Al_xHf_yO_z$, $Al_xSi_yO_z$, $B_2O_3$, $B_xP_yO_z$, $BiO_x$, $Bi_xTi_yO_z$, $BaTiO_3$, $CaO$, $CoO$, $CoO_x$, $Co_3O_4$, $CrO_x$, $CeO_2$, $Cu_2O$, $CuO$, $FeO$, $FeO_x$, $Ga2O3$, $GeO2$, $HfO_2$, $In_2O_3$, $LaAlO_3$, $La_2O_3$, $La_2CoO_3$, $La_2NiO_3$, $La_2MnO_3$, $MoN$, $Mo_2N$, $Mo_xN$, $MoO_2$, $MgO$, $MnO_x$, $NiO$, $Nb_2O_5$, $PtO_2$, $P_xB_yO_z$, $RuO$, $Sc_2O_3$, $SiO_2$, $Si_xTi_yO_z$, $Si_xZr_yO_z$, $Si_xHf_yO_z$, $SnO_2$, $Sb_2O_5$, $SrO$, $SrCO_3$, $SrTiO_3$, $Ta_2O_5$, $TaO_xN_y$, $Ti_xZr_yO_z$, $TiO_2$, $Ti_xHf_yO_z$, $VO_x$, $WO_3$, $Y_2O_3$, $ZnO$, $ZrO_2$, $PrO_x$, $Nd_2O_3$, $Sm_2O_3$, $Eu_2O_3$, $Gd_2O_3$, $Dy_2O_3$, $Ho_2O_3$, $Er_2O_3$, $Tm_2O_3$, $Lu_2O_3$ and a mixture therebetween, $0 \leq x \leq 1$, $0 \leq y \leq 1$, $0 \leq z \leq 1$.

16. The method of claim 9, wherein the first protection layer is formed of one selected from the group consisting of $Al_2O_3$, $AlN$, $AlP$, $AlAs$, $Al_xTi_yO_z$, $Al_xCr_yO_z$, $Al_xZr_yO_z$, $Al_xHf_yO_z$, $Al_xSi_yO_z$, $B_2O_3$, $BN$, $B_xP_yO_z$, $BiO_x$, $Bi_xTi_yO_z$, $BaS$, $BaTiO_3$, $CdS$, $CdSe$, $CdTe$, $CaO$, $CaS$, $CaF_2$, $CuGaS_2$, $CoO$, $CoO_x$, $CO_3O_4$, $CrO_x$, $CeO_2$, $Cu_2O$, $CuO$, $Cu_xS$, $FeO$, $FeO_x$, $GaN$, $GaAs$, $GaP$, $Ga_2O_3$, $GeO_2$, $HfO_2$, $Hf_3N_4$, $HgTe$, $InP$, $InAs$, $In_2O_3$, $In_2S_3$, $InN$, $InSb$, $LaAlO_3$, $La_2S_3$, $La_2O_2S$, $La_2O_3$, $La_2CoO_3$, $La_2NiO_3$, $La_2MnO_3$, $MoN$, $Mo_2N$, $Mo_xN$, $MoO_2$, $MgO$, $MnO_x$, $MnS$, $NiO$, $NbN$, $Nb_2O_5$, $PbS$, $PtO_2$, $PO_x$, $P_xB_yO_z$, $RuO$, $Sc_2O_3$, $Si_3N_4$, $SiO_2$, $SiC$, $Si_xTi_yO_z$, $Si_xZr_yO_z$, $Si_xHf_yO_z$, $SnO_2$, $Sb_2O_5$, $SrO$, $SrCO_3$, $SrTiO_3$, $SrS$, $SrS_{1-x}Se_x$, $SrF_2$, $Ta_2O_5$, $TaO_xN_y$, $Ta_3N_5$, $TaN$, $TaN_x$, $Ti_xZr_yO_z$, $TiO_2$, $TiN$, $Ti_xSi_yN_z$, $Ti_xHf_yO_z$, $VO_x$, $WO_3$, $W_2N$, $W_xN$, $WS_2$, $WXC$, $Y_2O_3$, $Y_2O_2S$, $ZnS_{1-x}Se_x$, $ZnO$, $ZnS$, $ZnSe$, $ZnTe$, $ZnF_2$, $ZrO_2$, $Zr_3N_4$, $PrO_x$, $Nd_2O_3$, $Sm_2O_3$, $Eu_2O_3$, $Gd_2O_3$, $Dy_2O_3$, $Ho_2O_3$, $Er_2O_3$, $Tm_2O_3$, $Lu_2O_3$ and a mixture therebetween, $0 \leq x \leq 1$, $0 \leq y \leq 1$, $0 \leq z \leq 1$.

17. The method of claim 9, further comprising the steps of:

forming a second seeding layer to overlay an exist surface of the transparent substrate;

forming a plurality of second nano-rods on the second seeding layer; and forming a second protection layer to completely overlay the plurality of second nano-rods.

* * * * *